US005940744A

United States Patent [19]

Uda

[11] Patent Number: 5,940,744

[45] Date of Patent: Aug. 17, 1999

[54] LOCAL FREQUENCY CORRECTION

[75] Inventor: Yoshihide Uda, Shizuoka, Japan

[73] Assignee: NEC Corporation, Tokyo, Japan

[21] Appl. No.: 08/884,123

[22] Filed: Jun. 27, 1997

[30] Foreign Application Priority Data

Jun. 28, 1996 [JP] Japan .................................... 8-188333

[51] Int. Cl.[6] ........................................................ H04B 1/40

[52] U.S. Cl. ............................. 455/75; 455/255; 375/344

[58] Field of Search .............................. 455/75, 255, 256, 455/257, 259, 265, 192.1, 192.2; 331/34; 445/182.1, 182.2, 208, 502; 375/344

[56] References Cited

FOREIGN PATENT DOCUMENTS 370335 3/1991 Japan .

6-350505 12/1994 Japan .

2308247 6/1997 United Kingdom .

*Primary Examiner*—Dwayne D. Bost

*Assistant Examiner*—Quochien B. Vuong

*Attorney, Agent, or Firm*—Sughrue, Mion, Zinn, Macpeak & Seas, PLLC

[57] ABSTRACT

A frequency correction of a local frequency is performed by first checking whether synchronization is acquired with respect to the received signal and, when the synchronization has been acquired, performing a frequency correction twice at different timing within a synchronization section, the frequency correction correcting the local frequency so as to reduce an error of the local frequency with respect to a received frequency of the received signal.

20 Claims, 3 Drawing Sheets

1 CYCLE 128 FRAMES 4min
(A)
FRAME0
FRAME1
......
FRAME126
FRAME127
FRAME0
1 FRAME 1.875sec
1.760sec
115msec
(B)
SYNC
BLOCK0
BLOCK1
......
BLOCK10
FRAME SYNC SECTION
DATA SECTION
20ms
20ms
10ms
20ms
20ms
25ms
(C)
BIT SYNC1
FRAME SYNC1
BIT SYNC2
FRAME SYNC2
FRAME INFO
FRAME SYNC3
DATA
10ms
20ms (MAX)
10ms
20ms (MAX)
ERROR DETECTION PERIOD T1
LO CORRECTION T2
ERROR VERIFICATION PERIOD T3
LO CORRECTION T4

LOCAL FREQUENCY CORRECTION

BACKGROUND OF THE INVENTION

1. Field of the Invention

The present invention generally relates to a radio communication system and, in particular, to a radio communication control method and apparatus which corrects the oscillation frequency of a local oscillator for transmission and reception.

2. Description of the Related Art

In a radio communication system, a local oscillator is indispensable for frequency conversion, modulation, or demodulation and its accuracy is important to achieve reliable and stable receiving/transmitting control. As one of conventional methods, an automatic frequency controller using frequency correction data has been disclosed in Japanese Patent Unexamined Publication No. 3-70335. The frequency correction data is produced from the error between a receiving frequency and a reference frequency. The receiving frequency is obtained by a carrier recovery circuit.

According to the above conventional method, however, it is not ensured that the corrected oscillation frequency is precisely matched with the receiving frequency. In other words, there is a possibility that the receiving/transmitting control is performed using incorrect reference frequency. For this, there may be cases where reliable and stable control cannot be achieved.

Further, according to the above conventional method, the receiving frequency is acquired in a carrier recovery portion of a received burst signal and then the acquired frequency is held in a data portion of the received burst signal. Based on the held receiving frequency, the frequency correction is performed. However, the frequency correction cannot be performed with accuracy until the synchronization is established because the data portion cannot be determined until then. Furthermore, in cases where received data cannot be demodulated due to variations in reference frequency and thereby the synchronization is not acquired, the automatic frequency correction function itself fails to be performed.

SUMMARY OF THE INVENTION

An object of the present invention is to provide a frequency correction method and apparatus which can obtain a stable and precise local oscillation frequency.

Another object of the present invention is to provide a radio communication control method and apparatus which can provide accuracy and stable control for transmission and reception.

According to the present invention, in a method for correcting a local frequency in a radio transceiver based on a received signal including a synchronization section and a data section, it is checked whether synchronization is acquired with respect to the received signal and, when the synchronization has been acquired, a frequency correction is performed twice at different timing within a synchronization section, the frequency correction correcting the local frequency so as to reduce an error of the local frequency with respect to a received frequency of the received signal.

Since the frequency correction is performed twice within the synchronization section, even though the first correction fails to precisely correct the local frequency, the second correction can verify the error of the local frequency and correct it. Therefore, the corrected local frequency becomes more stable and precise, resulting in stable and reliable communication control.

When the synchronization has not been acquired yet, the frequency correction may be performed at arbitrary timing. Since the frequency correction is performed before synchronization acquisition, the situation that the synchronization fails to be acquired due to variations in frequency can be prevented.

Further, the frequency correction may not be performed in the data section of the received signal when the synchronization has been acquired. This results in more stable reproduction of received data.

Furthermore, transmission may be prohibited until the error of the local frequency falls into the predetermined permissible range. This can prevent the situation that transmission data is transmitted to a base station with an incorrect frequency.

DETAILED DESCRIPTION OF THE PREFERRED EMBODIMENT

A communication control apparatus according to an embodiment of the present invention is included in a mobile terminal of a mobile radio communication system. The mobile terminal is provided with a transmission controller, a reception controller and a correction controller which performs control of a local oscillating frequency and permission/prohibition control of transmission before and after synchronization acquisition.

Figure 1:
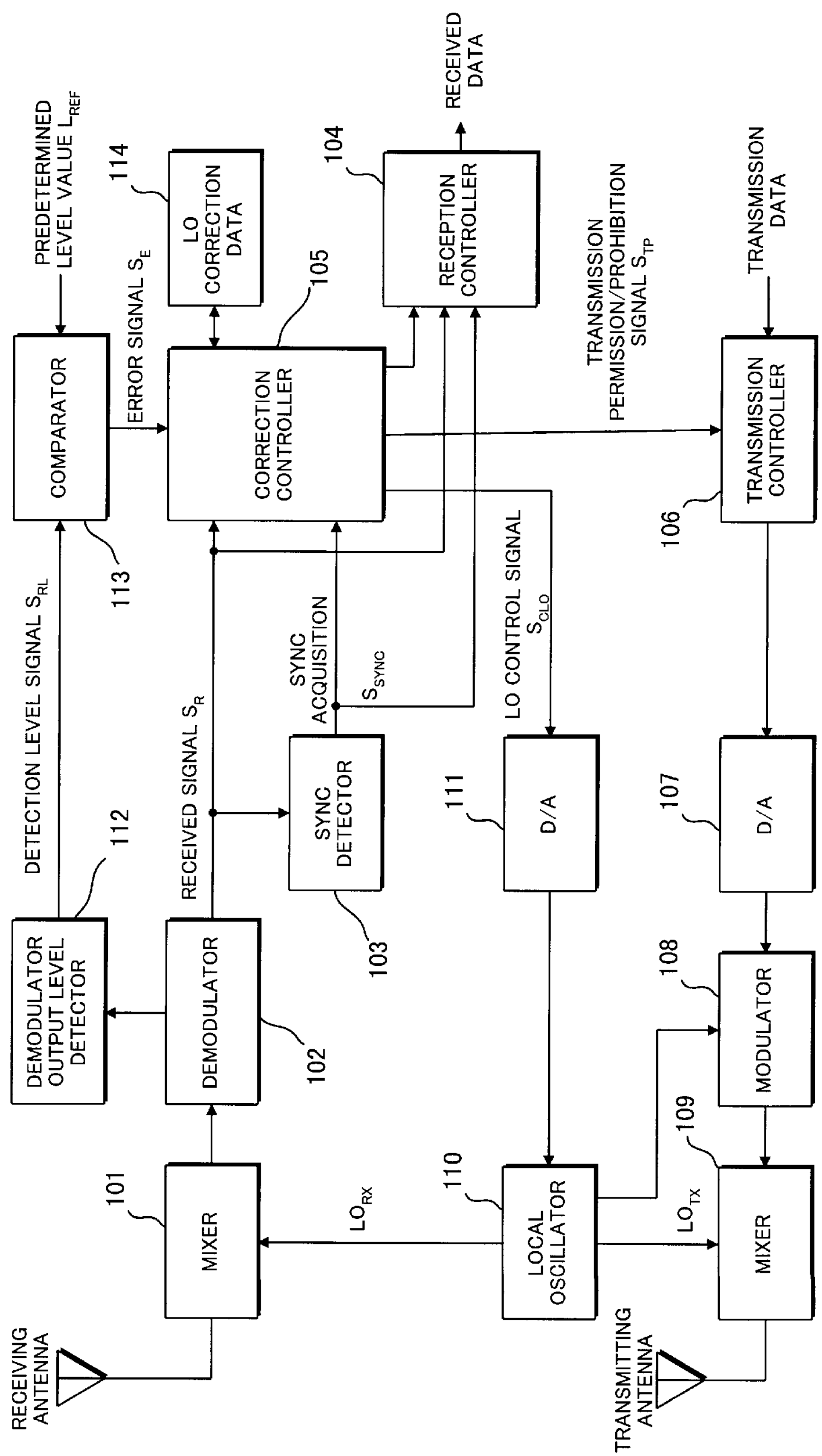
FIG. 1 is a block diagram showing an embodiment of a radio communication apparatus according to the present invention.

Referring to FIG. 1, the mobile terminal is comprised of a receiving system, a transmitting system and a correction system. The receiving system includes a mixer (or frequency converter) 101, a demodulator 102, a synchronization detector 103 and a reception controller 104. A received RF signal is converted to a received IF signal by the mixer 101 mixing the received RF signal with a local signal $LO_{RX}$. The received IF signal is demodulated into a baseband received signal $S_R$ by the demodulator 102 according to a predetermined modulation scheme. The synchronization detector 103 detects a predetermined sync signal pattern from the baseband received signal $S_R$ and produces a sync acquisition signal $S_{SYNC}$. The reception controller 104 receives the baseband received signal $S_R$ from the demodulator 102 and reproduces received data after frequency correction as will be described later. A correction controller 105 performs correction control of a local oscillating frequency based on the baseband receiving signal $S_R$, the sync acquisition signal $S_{SYNC}$ and a frequency error signal $S_E$.

The transmitting system includes a transmission controller 106, a digital-to-analog (D/A) converter 107, a modulator 108, and a mixer (or frequency converter) 109. Under control of the transmission controller 106, transmission data is transferred to the D/A converter 107 where it is converted to an analog transmission signal. The modulator 108 modulates a local signal of an intermediate frequency according to the analog transmission signal to produce a transmission IF signal. The transmission IF signal is converted to a transmission RF signal by the mixer 109 mixing the transmission IF signal with a local oscillating signal $LO_{TX}$. The transmission RF signal is transmitted through a transmitting antenna. The transmission controller 106 controls the transmission of the transmission data according to a transmission permission/prohibition signal $S_{TP}$ received from the correction controller 105. When receiving a transmission prohibition signal, for example, the transmission permission/prohibition signal $S_{TP}$ goes high, the transmission controller 106 stops the transmission operation.

The local oscillating signals $LO_{RX}$ and $LO_{TX}$ are generated by a local oscillator 110 whose oscillating frequency varies according to a local oscillation control signal $S_{CLO}$ received from the correction controller 105 through a D/A converter 111. A variable-frequency oscillator such as a phase-locked loop synthesizer may be used as the local oscillator 110.

The correction system includes the correction controller 105, a demodulation level detector 112, a comparator 113 and a correction data memory 114. The demodulation level detector 112 detects an output level of the demodulator 102 to produce a detection level signal $S_{RL}$. The comparator 113 compares the detection level signal $S_{RL}$ with a predetermined level value $L_{REF}$ to produce the error between them as a frequency error signal $S_E$. Since the output level of the demodulator 102 shows whether the demodulator 102 acquires the frequency of the IF received signal output by the mixer 101, the frequency error of the local oscillating frequency $LO_{RX}$ can be detected by monitoring the output level of the demodulator 102.

When receiving the frequency error signal $S_E$ from the comparator 113, the correction controller 105 reads correction data from the correction data memory 114 to produce the local oscillation control signal $S_{CLO}$. The correction data memory 114 previously stores correction data which is used to correct an frequency error indicated by the frequency error signal $S_E$. The local oscillation control signal $S_{CLO}$ is converted to an analog signal by the D/A converter 111 and then is output to the local oscillator 110.

As will be described hereinafter, in the case where the synchronization has not been acquired yet, the frequency error detection and correction are performed at any given time instant. After synchronization acquisition, the frequency error detection and verification and the frequency error correction are performed at predetermined time instants in a frame synchronization period. The details will be described in accordance with an example of a received signal as shown in FIG. 2.

Figure 2:
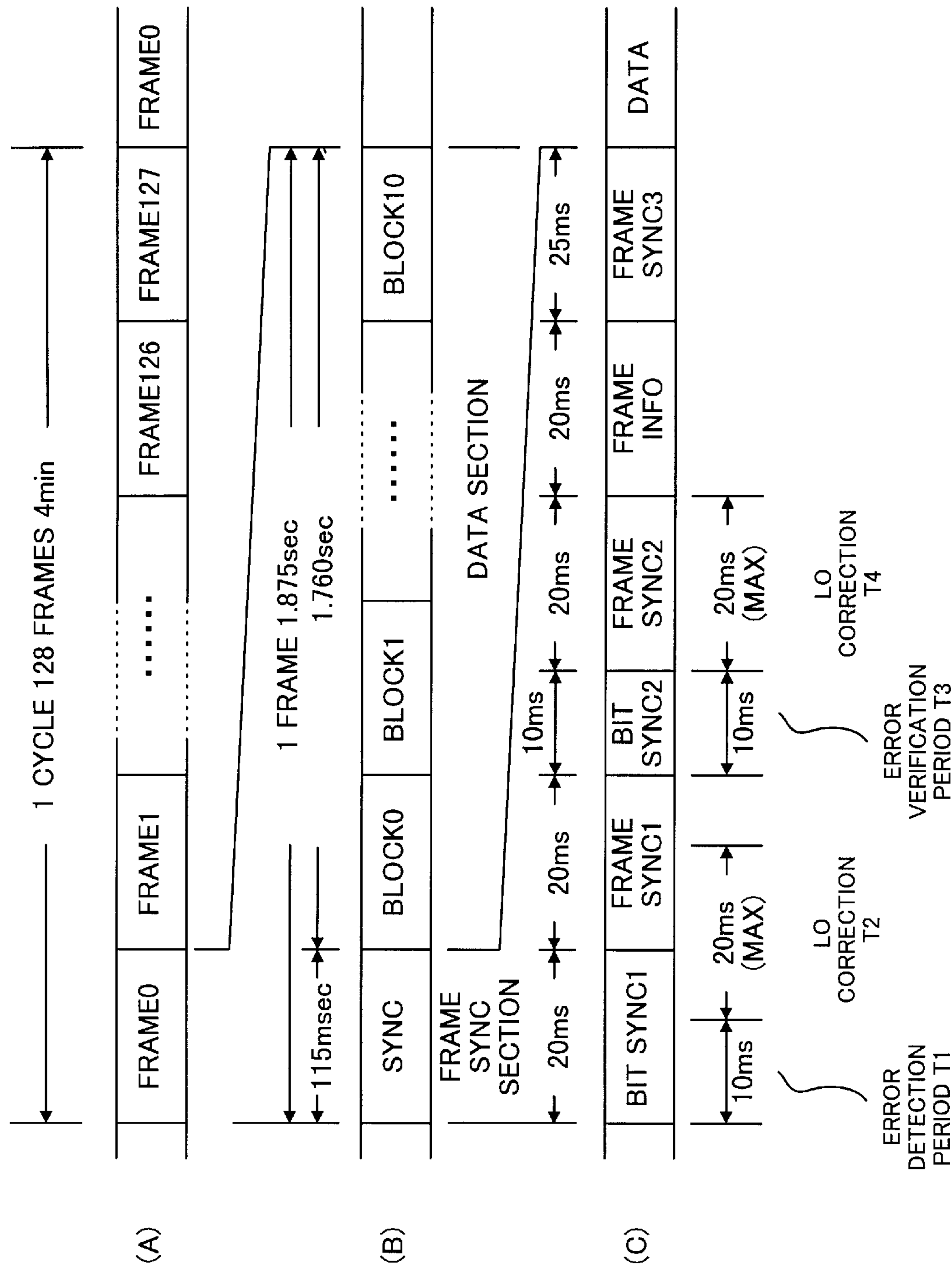
FIG. 2 is a format diagram showing an example of a received signal for explanation of an embodiment of a radio communication method according to the present invention.

Referring to FIG. 2, a received signal is comprised of a plurality of cycles each including 128 frames for 4 minutes, each frame of 1.875 sec including a frame sync section of 115 msec and a data section of 1.760 sec following the frame sync section. The data section contains 10 data blocks. The frame sync section contains a first bit sync signal (Bit Sync1) for 20 msec and a first frame sync signal (Frame Sync1) for 20 msec, a second bit sync signal (Bit Sync2) for 10 msec and a second frame sync signal (Frame Sync2) for 20 msec, and a frame information signal (Frame Info) for 20 msec and a third frame sync signal (Frame Sync3) for 25 msec.

The frequency error detection and correction are performed at any given time instant until the synchronization has been acquired. When the synchronization has been acquired, the frequency error detection and verification and the frequency error correction are performed at predetermined time instants in a frame synchronization section (Sync) which is the first time period, 115 msec, of a frame. More specifically, as shown (C) in FIG. 2, the frequency error is detected for an error detection period T1 of 10 msec, that is, the first time period of the first bit sync signal (Bit Sync1). If the frequency error is greater than a predetermined permissible range, the frequency correction is performed using the frequency error signal $S_E$ for a first correction period T2 which is a maximum of 20 msec following the error detection period T1. Subsequently, for an error verification period T3 of 10 msec which is the second bit sync signal (Bit Sync2) in the same frame sync section, the error verification is performed and, if a substantial error is detected as described above, then the frequency correction is performed using the frequency error signal $S_E$ for a second correction period T4 which is a maximum of 20 msec following the error verification period T3.

Figure 3:
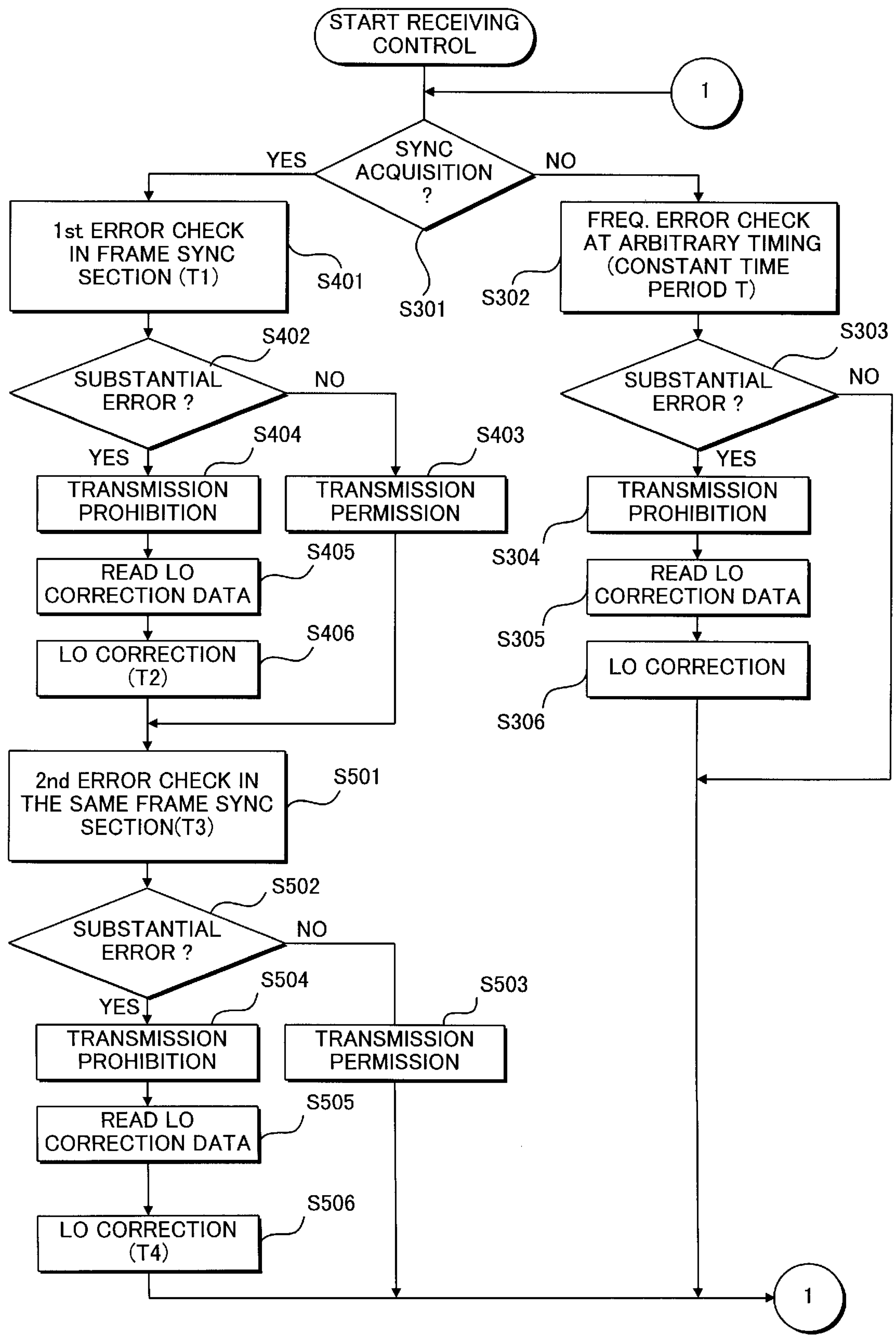
FIG. 3 is a flowchart showing the embodiment of the radio communication method according to the present invention.

Referring to FIG. 3, when the receiving control starts, the correction controller 105 checks the state of the sync acquisition signal $S_{SYNC}$ (step S301). In this embodiment, if the state of the sync acquisition signal $S_{SYNC}$ is in a set state or the logical value 1 (true), then it indicates that the synchronization has been acquired. When the state of the sync acquisition signal $S_{SYNC}$ is in a reset state or the logical value 0 (false), then it indicates that the synchronization has not been acquired yet.

In cases where the synchronization has not been acquired yet (NO in step S301), the correction controller 105 checks the frequency error signal $S_E$ at any given time (step S302). When the error between the detection level signal $S_{RL}$ and the predetermined level value $L_{REF}$ exceeds the permissible range, which means that the local oscillating frequency $LO_{RX}$ generated by the local oscillator 110 is not matched with the actual receiving frequency (YES in step S303), the correction controller 105 outputs the transmission prohibition signal $S_{TP}$ to the transmission controller 106 (step S304) and reads correction data corresponding to the detected error signal $S_E$ from the correction data memory 114 to produce a local oscillation control signal $S_{CLO}$ (step S305). The local oscillation control signal $S_{CLO}$ is converted from digital to analog by the D/A converter 111 and then is used to correct the local oscillating frequency $LO_{RX}$ (step S306). When the local frequency correction is completed or when the error between the detection level signal $S_{RL}$ and the predetermined level value $L_{REF}$ falls within the permissible range (NO in step S303), the correction controller 105 transfers control to the step S301 of checking the state of the sync acquisition signal $S_{SYNC}$.

In cases where the synchronization has been acquired (YES in step S301), the correction controller 105 starts the following first error check routine (steps S401–S406). More specifically, the correction controller 105 first checks the frequency error signal $S_E$ during the error detection period T1 of 10 msec in the frame sync section Sync as shown in FIG. 2(C) (step S401). When the error between the detection level signal $S_{RL}$ and the predetermined level value $L_{REF}$ falls within the permissible range, that is, no substantial error exists (NO In step S402), the correction controller 105 outputs a transmission permission signal to the transmission controller 106 (step S403). The transmission permission signal causes the transmission controller 106 to be ready for transmitting.

On the other hand, when the error between the detection level signal $S_{RL}$ and the predetermined level value $L_{REF}$ exceeds the permissible range, that is, a substantial error exists (YES in step S402), the correction controller 105 outputs the transmission prohibition signal to the transmission controller 106 (step S404) and reads correction data corresponding to the detected error signal $S_E$ from the correction data memory 114 to produce a local oscillation control signal $S_{CLO}$ (step S405). The local oscillation control signal $S_{CLO}$ is converted from digital to analog by the D/A converter 111 and then is used to correct the local oscillating frequency $LO_{RX}$ (step S406). The error correction period T2 is a maximum of 20 msec following the error detection period T1 in the frame sync section Sync as shown in FIG. 2 (C).

When the first error check routine (steps S401–S406) is completed, the correction controller 105 performs a second error check routine or an error verification routine (steps S501–S506). The correction controller 105 first checks the frequency error signal $S_E$ during the error verification period T3 which corresponds to the Bit Sync2 of 10 msec in the frame sync section Sync as shown In FIG. 2(C) (step S501). When the error between the detection level signal $S_{RL}$ and the predetermined level value $L_{REF}$ falls within the permissible range, that is, no substantial error exists (NO in step S502), the correction controller 105 outputs a transmission permission signal to the transmission controller 106 (step S403). The transmission permission signal causes the transmission controller 106 to be ready for transmitting.

On the other hand, when the error between the detection level signal $S_{RL}$ and the predetermined level value $L_{REF}$ exceeds the permissible range, that is, a substantial error exists (YES in step S502), the correction controller 105 outputs the transmission prohibition signal to the transmission controller 106 (step S504) and reads correction data corresponding to the detected error signal $S_E$ from the correction data memory 114 to produce a local oscillation control signal $S_{CLO}$ (step S505). The local oscillation control signal $S_{CLO}$ is converted from digital to analog by the D/A converter 111 and then is used to correct the local oscillating frequency $LO_{RX}$ (step S506). The second error correction period T4 is a maximum of 20 msec following the error verification period T3 in the frame sync section Sync as shown in FIG. 2 (C).

When the second error check routine (steps S501–S506) is completed, the correction controller 105 transfers control back to the step S301 and the first and second error check routines as described above are repeated in only the frame sync section Sync of each frame. When receiving a completion signal showing the completion of the second error check routine, the reception controller 104 reproduces the received data by decoding the data section following the frame sync section of the received signal which is received using the corrected receiving frequency.

What is claimed is:

1. A method for correcting a local frequency in a radio transceiver based on a received signal including a synchronization section and a data section, the method comprising the steps of:

a) checking whether synchronization is acquired with respect to the received signal; and b) performing a frequency correction twice at different timing within a synchronization section when the synchronization has been acquired, the frequency correction correcting the local frequency so as to reduce an error of the local frequency with respect to a received frequency of the received signal.

2. The method according to claim 1, further comprising the step of:

c) performing the frequency correction at arbitrary timing when the synchronization has not been acquired yet.

3. The method according to claim 1, wherein the frequency correction comprises:

detecting a frequency error of the local frequency with respect to the received frequency within the synchronization section; and correcting the local frequency based on the frequency error when the frequency error exceeds a predetermined permissible range.

4. The method according to claim 1, wherein the frequency correction is not performed in the data section of the received signal when the synchronization has been acquired.

5. A method for correcting a local frequency in a radio transceiver based on a received signal including a synchronization section and a data section, the method comprising the steps of:

a) checking whether synchronization is acquired with respect to the received signal;

b) checking a first frequency error of the local frequency with respect to a received frequency of the received signal at a first predetermined time period within the synchronization section when the synchronization has been acquired;

c) correcting the local frequency based on the first frequency error when the first frequency error exceeds a predetermined permissible range;

d) checking a second frequency error of the local frequency with respect to the received frequency at a second predetermined time period within the synchronization section after the step c); and e) correcting the local frequency based on the second frequency error when the second frequency error exceeds the predetermined permissible range.

6. The method according to claim 5, further comprising the step of:

f) checking a frequency error of the local frequency with respect to the received frequency at arbitrary timing when the synchronization has not been acquired yet; and g) correcting the local frequency based on the frequency error when the frequency error exceeds the predetermined permissible range.

7. A communication control method for a radio communication apparatus having a local oscillator, a local frequency generated by the local oscillator being corrected based on a received signal including a synchronization section and a data section, the method comprising the steps of:

a) checking whether synchronization is acquired with respect to the received signal;

b) performing a frequency correction twice at different timing within a synchronization section when the synchronization has been acquired, the frequency correction correcting the local frequency so as to reduce an error of the local frequency with respect to a received frequency of the received signal to a predetermined permissible range; and c) producing received data from the data section of the received signal which is received using the local frequency corrected by performing the frequency correction twice.

8. The communication control method according to claim 7, further comprising the step of:

d) performing the frequency correction at arbitrary timing when the synchronization has not been acquired yet.

9. The communication control method according to claim 7, further comprising the step of:

prohibiting transmission until the error of the local frequency falls into the predetermined permissible range.

10. The communication control method according to claim 8, further comprising the steps of:

prohibiting transmission when the error of the local frequency exceeds the predetermined permissible range.

11. The communication control method according to claim 7, wherein the frequency correction comprises:

detecting a frequency error of the local frequency with respect to the received frequency within the synchronization section; and correcting the local frequency based on the frequency error when the frequency error exceeds a predetermined permissible range.

12. The communication control method according to claim 7, wherein the frequency correction is not performed in the data section of the received signal when the synchronization has been acquired.

13. A frequency correction circuit for controlling a local oscillator provided in a radio communication apparatus based on a received signal including a synchronization section and a data section, comprising:

a sync detector for detecting synchronization acquisition with respect to the received signal;

an error detector for detecting an error of the local frequency with respect to a received frequency of the received signal; and a correction controller for correcting the local frequency twice at different timing within a synchronization section when the synchronization has been acquired such that the local frequency is corrected so as to reduce the error within a predetermined permissible range.

14. The frequency correction circuit according to claim 13, wherein the correction controller corrects the local frequency at arbitrary timing when the synchronization has not been acquired yet.

15. The frequency correction circuit according to claim 13, wherein the correction controller does not correct the local frequency in the data section of the received signal when the synchronization has been acquired.

16. A radio communication apparatus comprising:

a local oscillator for generating a local frequency;

a transceiver for transmitting a transmission signal and receiving a received signal based on the local frequency, the received signal including a synchronization section and a data section;

a sync detector for detecting synchronization acquisition with respect to the received signal;

an error detector for detecting an error of the local frequency with respect to a received frequency of the received signal;

a correction controller for correcting the local frequency twice at different timing within a synchronization section when the synchronization has been acquired such that the local frequency is corrected so as to reduce the error within a predetermined permissible range; and a receiving controller for producing received data from the data section of the received signal which is received by the transceiver using a corrected local frequency.

17. The radio communication apparatus according to claim 16, wherein the correction controller corrects the local frequency at arbitrary timing when the synchronization has not been acquired yet.

18. The radio communication apparatus according to claim 16, wherein the correction controller prohibits the transceiver transmitting a transmission signal until the error of the local frequency falls into the predetermined permissible range.

19. The radio communication apparatus according to claim 17, wherein the correction controller prohibits the transceiver transmitting a transmission signal when the error of the local frequency exceeds the predetermined permissible range.

20. The radio communication apparatus according to claim 16, wherein the correction controller does not correct the local frequency in the data section of the received signal when the synchronization has been acquired.

* * * * *